United States Patent
Wu et al.

(10) Patent No.: US 11,257,687 B2
(45) Date of Patent: Feb. 22, 2022

(54) METHOD FOR REPAIRING ETCHING DAMAGE ON NITRIDE-BASED EPITAXIAL LAYER OF OPTOELECTRONIC DEVICE AND OPTOELECTRONIC DEVICE ATTRIBUTABLE THERETO

(71) Applicant: NATIONAL CHUNG-HSING UNIVERSITY, Taichung (TW)

(72) Inventors: Tung-Hsing Wu, Taichung (TW);
Shuo-Huang Yuan, Taichung (TW);
Chih-Yi Yang, Taichung (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 16/525,225

(22) Filed: Jul. 29, 2019

(65) Prior Publication Data
US 2020/0043749 A1 Feb. 6, 2020

(30) Foreign Application Priority Data
Jul. 31, 2018 (TW) .................. 107126431

(51) Int. Cl.
*H01L 21/477* (2006.01)
*H01J 37/32* (2006.01)
*H01L 33/00* (2010.01)

(52) U.S. Cl.
CPC ...... *H01L 21/477* (2013.01); *H01J 37/32743* (2013.01); *H01L 33/007* (2013.01)

(58) Field of Classification Search
CPC .......................... H01L 21/477; H01L 33/007
See application file for complete search history.

(56) References Cited

U.S. PATENT DOCUMENTS

| 2014/0103289 A1* | 4/2014 | Liao | H01L 21/02625 257/13 |
| 2015/0126022 A1* | 5/2015 | Kim | H01L 21/28575 438/513 |
| 2017/0117202 A1* | 4/2017 | Tang | H01L 21/02274 |
| 2020/0091376 A1* | 3/2020 | Lim | H01L 33/40 |

OTHER PUBLICATIONS

Definition of "Vapor", Cambridge Dictionary (2020), retrieved from https://dictionary.cambridge.org/us/dictionary/english/vapor (Year: 2020).*

* cited by examiner

*Primary Examiner* — Michele Fan
(74) *Attorney, Agent, or Firm* — Michael Best & Friedrich LLP

(57) ABSTRACT

A method for repairing etching damage on a nitride-based epitaxial layer of an optoelectronic device and an optoelectronic device attributable thereto are provided. The method includes: providing a nitrogen-containing working liquid and a annealing apparatus having a reaction chamber; heating the reaction chamber to a predetermined temperature; atomizing the nitrogen-containing working liquid, and introducing the thus formed nitrogen-containing spray into the reaction chamber; and subjecting the optoelectronic device to an annealing treatment in the reaction chamber in the presence of the nitrogen-containing spray, so as to repair the etching damage on the nitride-based epitaxial layer.

7 Claims, 7 Drawing Sheets

METHOD FOR REPAIRING ETCHING DAMAGE ON NITRIDE-BASED EPITAXIAL LAYER OF OPTOELECTRONIC DEVICE AND OPTOELECTRONIC DEVICE ATTRIBUTABLE THERETO

CROSS-REFERENCE TO RELATED APPLICATION

This application claims priority of Taiwanese Patent Application No. 107126431, filed on Jul. 31, 2018.

FIELD

The present disclosure relates to a method for repairing etching damage on a nitride-based epitaxial layer of an optoelectronic device, as well as an optoelectronic device attributable thereto.

BACKGROUND

For manufacturing an optoelectronic device such as a light-emitting diode (LED), plasma etching is usually carried out to expose a surface of a semiconductor epitaxial layer such as a nitride-based epitaxial layer for electrodes to be disposed thereon. However, plasma etching might cause damage to the nitride-based epitaxial layer, resulting in a poor performance of the thus manufactured optoelectronic device.

In order to repair etching damage and thus improve the performance of the optoelectronic device, the nitride-based epitaxial layer is subjected to a suitable repair treatment, such as post-annealing with nitrogen gas, a nitrogen plasma treatment, coating with a nitride-based film, and immersion in a nitride-based alkaline solution.

However, each of these conventional repair treatments has its own shortcoming. For example, post-annealing with nitrogen gas requires a very high temperature for direct dissociation of nitrogen gas molecules, while the nitrogen plasma treatment might generate additional problems associated with etching. Likewise, coating with a nitride-based film incurs a high manufacturing cost in addition to difficulty of achieving a homogeneous coating. Although immersion in a nitride-based alkaline solution has an advantage of low manufacturing cost, it has limitation that reduces its practicability. That is, the nitride-based alkaline solution should be continuously heated, and thus in a long time period, the concentration thereof might be altered due to evaporation, resulting in reduced homogeneity and efficiency of repairing the nitride-based epitaxial layer.

Therefore, it remains a goal to be achieved for those skilled in the art to improve the efficiency of the method of repairing etching damage on the nitride-based epitaxial layer, which in turn reduces manufacturing cost and improves the performance of the optoelectronic device.

SUMMARY

Therefore, an object of the present disclosure is to provide a method for repairing etching damage on a nitride-based epitaxial layer of an optoelectronic device that can alleviate at least one of the drawbacks of the prior art.

According to one aspect of the present disclosure, the method for repairing etching damage on a nitride-based epitaxial layer of an optoelectronic device includes the steps of:

(A) providing a nitrogen-containing working liquid, and a annealing apparatus having a reaction chamber;
(B) heating the reaction chamber of the annealing apparatus to a predetermined temperature;
(C) atomizing the nitrogen-containing working liquid to obtain a nitrogen-containing spray, and then introducing the nitrogen-containing spray into the reaction chamber; and
(D) subjecting the optoelectronic device to an annealing treatment in the reaction chamber of the annealing apparatus in the presence of the nitrogen-containing spray, so as to repair the etching damage on the nitride-based epitaxial layer of the optoelectronic device.

Another object of the present disclosure is to provide an optoelectronic device that can alleviate at least one of the drawbacks of the prior art.

According to another aspect of the present disclosure, the optoelectronic device, which may be attributed to the above-mentioned method, includes a substrate, a buffering layer, a repaired nitride-based epitaxial layer, a light-emitting layer, a contacting layer, a first electrode and a second electrode. The buffering layer is disposed on the substrate. The repaired nitride-based epitaxial layer is disposed on the buffering layer and has an atomic ratio of nitrogen to oxygen which is less than 1.8. The light-emitting layer is disposed on the repaired nitride-based epitaxial layer and exposes a portion thereof. The contacting layer is disposed on the light-emitting layer. The first electrode is disposed on the exposed portion of the repaired nitride-based epitaxial layer. The second electrode is disposed on the contacting layer.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
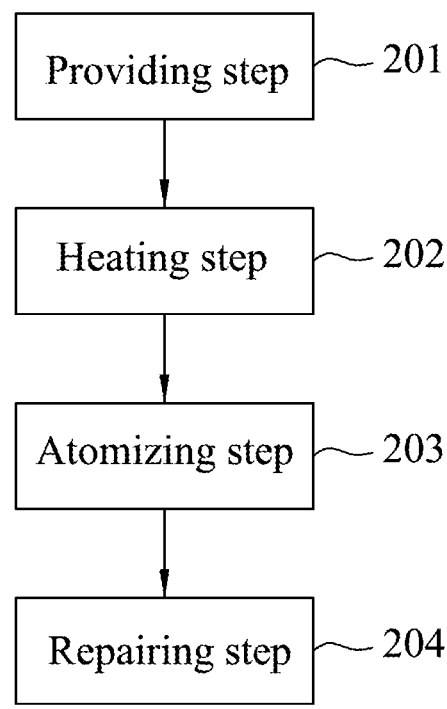
FIG. 1 is a flow chart illustrating consecutive steps of an embodiment of a method for repairing etching damage on a nitride-based epitaxial layer of an optoelectronic device according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 2:
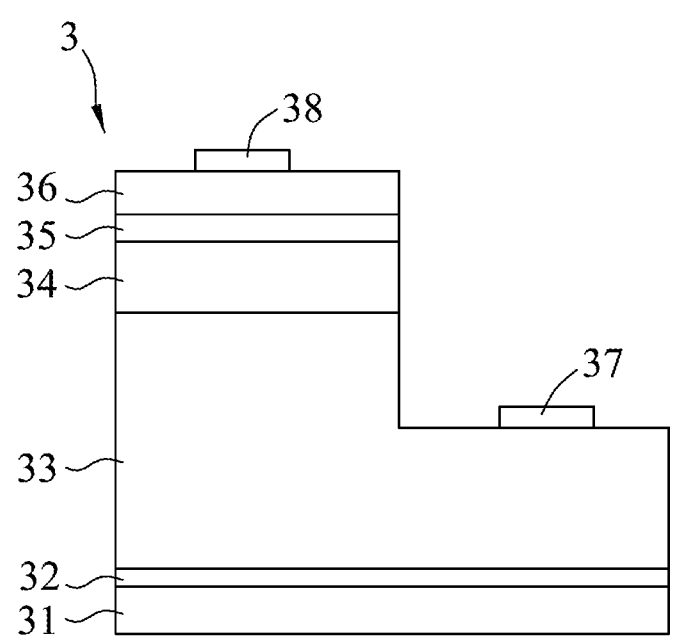
FIG. 2 is a schematic view illustrating the optoelectronic device repaired by the embodiment of the method according to the present disclosure.
Figure 3:
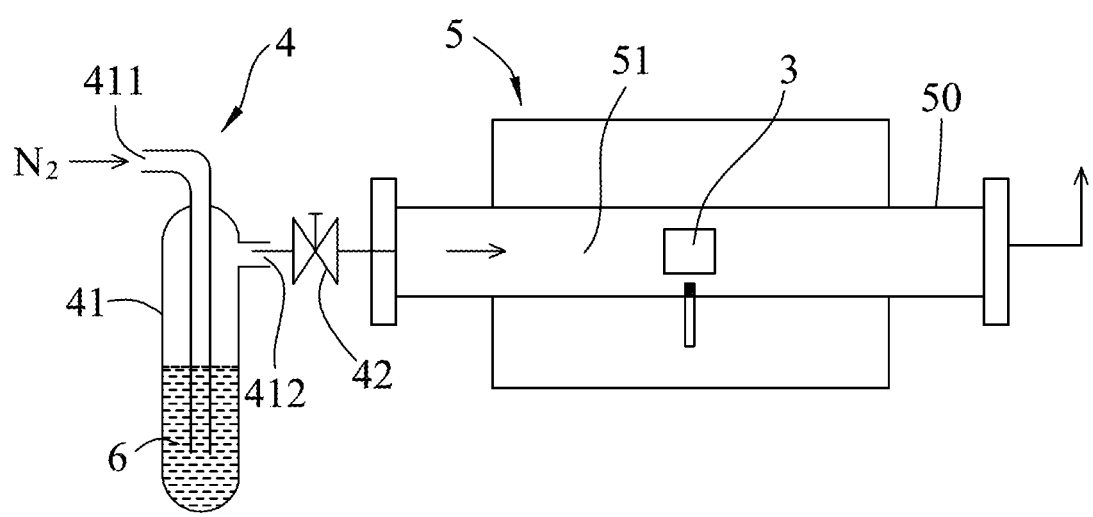
FIG. 3 is a schematic view illustrating an atomizing apparatus configured to be connected to an annealing apparatus as used in the embodiment of the method according to the present disclosure.

Referring to FIGS. 1 to 3, an embodiment of a method for repairing etching damage on a nitride-based epitaxial layer 33 of an optoelectronic device 3 is shown and includes a providing step 201, a heating step 202, an atomizing step 203 and a repairing step 204, which will be described in details as follows.

For illustration purpose only and not for the purpose of limiting the present disclosure, an example of the optoelectronic device 3 adapted to be repaired by the method of this disclosure is an aluminum gallium nitride light-emitting diode (AlGaN LED) as shown in FIG. 2. The nitride-based epitaxial layer 33 to be repaired may include $Al_xGa_{1-x}N$ (i.e., aluminum nitride-based), in which $0.1 \leq x \leq 0.7$. The etching damage may result from any etching process, such as plasma etching.

In providing step 201, an annealing apparatus 5 having a reaction chamber 51 and to receive a nitrogen-containing working liquid 6 is provided. Examples of the annealing apparatus 5 may include, but are not limited to, an annealing tube furnace, and a rapid thermal annealing furnace. In this embodiment, the annealing apparatus 5 includes a tube furnace 50 defining the reaction chamber 51. The nitrogen-containing working liquid 6 suitable for the present disclosure may be selected based on the material of the nitride-based epitaxial layer 33 of the optoelectronic device 3 to be repaired. Examples of the nitrogen-containing working liquid 6 may include, but are not limited to, aqueous ammonia and an ammonium sulfide solution. In this embodiment, the nitrogen-containing working liquid 6 is aqueous ammonia.

An atomizing apparatus 4 may be further provided in providing step 201, which is configured to connect to the annealing apparatus 5. The atomizing apparatus 4 includes a vessel 41 for accommodating the nitrogen-containing working liquid 6 therein, and a flow control valve 42 that connects the vessel 41 and the reaction chamber 51. The vessel 41 includes an inlet 411 for introducing a carrier gas therein, and an outlet 412 that is connected to the flow control valve 42.

In heating step 202, the reaction chamber 51 of the annealing apparatus 5 is heated to a predetermined temperature, which may be adjusted by those skilled in the art according to the structure of the optoelectronic device 3 and actual needs.

In atomizing step 203, the nitrogen-containing working liquid 6 is atomized to obtain a nitrogen-containing spray, which is then introduced into the reaction chamber 51.

As used herein, the term "atomize" or "atomization" means the reduction or separation of liquids to very small particles such that a spray or fine mist is formed therefrom.

As used herein, the term "spray" refers to a dynamic collection of drops dispersed in the carrier gas, and may encompass an aerosol, a fine mist, liquid droplets, a fine stream, and combinations thereof.

Specifically, the atomizing step 203 is performed by supplying the carrier gas from the inlet 411 into the nitrogen-containing working liquid 6 accommodated in the vessel 41, such that kinetic energy of the carrier gas is transferred to the nitrogen-containing working liquid 6, so as to atomize the nitrogen-containing working liquid 6 to form the nitrogen-containing spray (i.e., in the form of mist). After that, the nitrogen-containing spray is discharged from the outlet 412 and introduced into the heated reaction chamber 51 via the flow control valve 42. Examples of the carrier gas suitable for this disclosure may include, but are not limited to, nitrogen gas, argon gas, oxygen gas, hydrogen gas, helium gas and combinations thereof.

In repairing step 204, the optoelectronic device 3, which is placed in the heated reaction chamber 51 of the annealing apparatus 5, is subjected to an annealing treatment in the presence of the nitrogen-containing spray, so as to repair the etching damage on the nitride-based epitaxial layer 33.

Without wishing to be bound by any theory, it is believed that, on an etched surface of the nitride-based epitaxial layer 33, nitrogen bonds of nitride would be destroyed to generate dangling bonds, which then attract oxygen atoms in the atmosphere to form native oxides. Due to the high temperature of the reaction chamber 51, the nitrogen-containing spray would dissociate to form ammonium ions ($NH_4^+$) and hydroxide ions ($OH^-$), which are evenly distributed in the reaction chamber 51 for repairing the etching damage. That is, the native oxides on the nitride-based epitaxial layer 33 may be removed by the ammonium ions ($NH_4^+$) to expose the dangling bonds, which then attract the hydroxide ions ($OH^-$) to react therewith, so that more oxygen atoms are bound to the dangling bonds (i.e., oxygen doping), thereby providing more free electrons on the nitride-based epitaxial layer 33 so as to repair the etching damage thereon. In certain embodiments, the repaired nitride-based epitaxial layer 33 may have an atomic ratio of nitrogen to oxygen less than 1.8. Similarly, when the ammonium sulfide solution serves as the nitrogen-containing working liquid 6, it is believed to be capable of providing sulfur atoms that bind to the exposed dangling bonds (i.e., sulfur doping) for repairing the etching damage on the nitride-based epitaxial layer 33.

After the repairing step 204, a metal electrode may be disposed on the repaired nitride-based epitaxial layer 33, and a contact resistance therebetween may be effectively reduced.

Referring back to FIG. 2, the optoelectronic device 3 that has been repaired by the method of the present disclosure may include a substrate 31, a buffering layer 32, the repaired nitride-based epitaxial layer 33, a light-emitting layer 34, a contacting layer 36, a first electrode 37 and a second electrode 38. The buffering layer 32 is disposed on the substrate 31. The repaired nitride-based epitaxial layer 33 is disposed on the buffering layer 32. The light-emitting layer 34 is disposed on the nitride-based epitaxial layer 33 and exposes a portion of the nitride-based epitaxial layer 33, which is repaired by the method of the present disclosure and has an atomic ratio of nitrogen to oxygen less than 1.8. The contacting layer 36 is disposed on the light-emitting layer 34. The first electrode 37 is disposed on the exposed portion of the repaired nitride-based epitaxial layer 33. The second electrode 38 is disposed on the contacting layer 36. The optoelectronic device 3 may further include an electron-blocking layer 35 disposed between the light-emitting layer 34 and the contacting layer 36.

An example of the substrate 31 suitable for use in the present disclosure may be a sapphire substrate. The buffering layer 32 may be made from a nitride-based material, so that the crystal defect generated by dislocation of the nitride-based epitaxial layer 33 may be reduced. The light-emitting layer 34 may have a quantum well structure. The contacting layer 36 may be made from gallium nitride (GaN), so as to diffuse currents. It should be noted that the suitable quantum well structure of the light-emitting layer 34, and the materials suitable for making the substrate 31, the buffering layer 32, the electron-blocking layer 35 and the contacting layer 36 are well known to those skilled in the art, and therefore are not further described herein for the sake of brevity.

The present disclosure will be further described by way of the following examples. However, it should be understood that the following examples are intended solely for the purpose of illustration and should not be construed as limiting the disclosure in practice.

Example 1 (E1)

The optoelectronic device 3 to be repaired in this example was an aluminum gallium nitride (AlGaN) light-emitting diode, which includes the sapphire substrate 31, the undoped $Al_xGa_{1-x}N$ buffering layer 32 disposed on the sapphire substrate 31, the n-type $Al_xGa_{1-x}N$ (i.e., aluminum nitride-based) epitaxial layer 33 (x=0.55) disposed on the undoped $Al_xGa_{1-x}N$ buffering layer 32, the light-emitting layer 34 disposed on the aluminum nitride-based epitaxial layer 33 and having a multiple quantum well structure, the $p^-$-type GaN electron-blocking layer 35 disposed on the light-emitting layer 34, and the $p^+$-type GaN contacting layer 36 disposed on the $p^-$-type GaN electron-blocking layer 35 (see FIG. 2). The optoelectronic device 3 has been subjected to plasma etching, so that a portion of the aluminum nitride-based epitaxial layer 33 was exposed, and plasma etching-induced damage was generated on the aluminum nitride-based epitaxial layer 33. The annealing apparatus 5 used in E1 was an annealing tube furnace having a tube furnace 50 defining a reaction chamber 51, the nitrogen-containing working liquid 6 was aqueous ammonia accommodated in the vessel 41 of the atomizing apparatus 4, and the carrier gas for atomizing the nitrogen-containing working liquid 6 was argon gas. The method of E1 was described in details as follows with reference to FIG. 3.

First, the reaction chamber 51 of the annealing apparatus 5 was heated to a predetermined temperature of 800° C. using a thermocouple, and then argon gas was supplied from the inlet 411 into the aqueous ammonia accommodated in the vessel 41, so as to atomize the aqueous ammonia to form an aqueous ammonia spray. Thereafter, the aqueous ammonia spray was discharged from the outlet 412 and introduced into the reaction chamber 51 at a flow rate of 10 sccm via the flow control valve 42. Then, the optoelectronic device 3 was placed in the heated reaction chamber 51 to conduct an annealing treatment for 20 minutes. During the annealing treatment, the aqueous ammonia spray dissociated to form ammonium ions ($NH_4^+$) and hydroxide ions ($OH^-$) for repairing the etching damage on the aluminum nitride-based epitaxial layer 33. After the annealing treatment, the first electrode 37 (i.e., Ti/Al/Ti/Au electrode) was disposed on the repaired aluminum nitride-based epitaxial layer 33, and the second electrode 38 (i.e., Ni/Au electrode) was disposed on the $p^+$-type GaN contacting layer 36, so as to obtain the repaired optoelectronic device 3.

Example 2 (E2)

The method of E2 was similar in procedure to that of E1, except that the carrier gas was nitrogen gas.

Comparative Example 1 (CE1)

The method of CE1 was similar in procedure to that of E1, except that the nitrogen-containing working liquid 6 was dispensed with (i.e., no generation of the nitrogen-containing spray) in CE1, and the nitrogen gas was directly introduced into the reaction chamber 51 to treat the optoelectronic device 3.

Comparative Example 2 (CE2)

The method of CE2 was similar in procedure to that of E1, except that the nitrogen-containing working liquid 6 was replaced with deionized water in CE2, and the carrier gas was nitrogen gas.

Performance Test
1. Current-Voltage (I-V) Characteristics

The current-voltage (I-V) characteristics of the Ti/Al/Ti/Au electrode 37 on the aluminum nitride-based epitaxial layer 33 treated by the methods of E1, E2, CE1 and CE2 were measured at room temperature using an Agilent HP 4155B semiconductor parameter analyzer. For the comparison purpose, a control optoelectronic device, which was not subjected to any treatment after plasma etching, was also subjected to the determination of current-voltage (I-V) characteristics.

Figure 4:
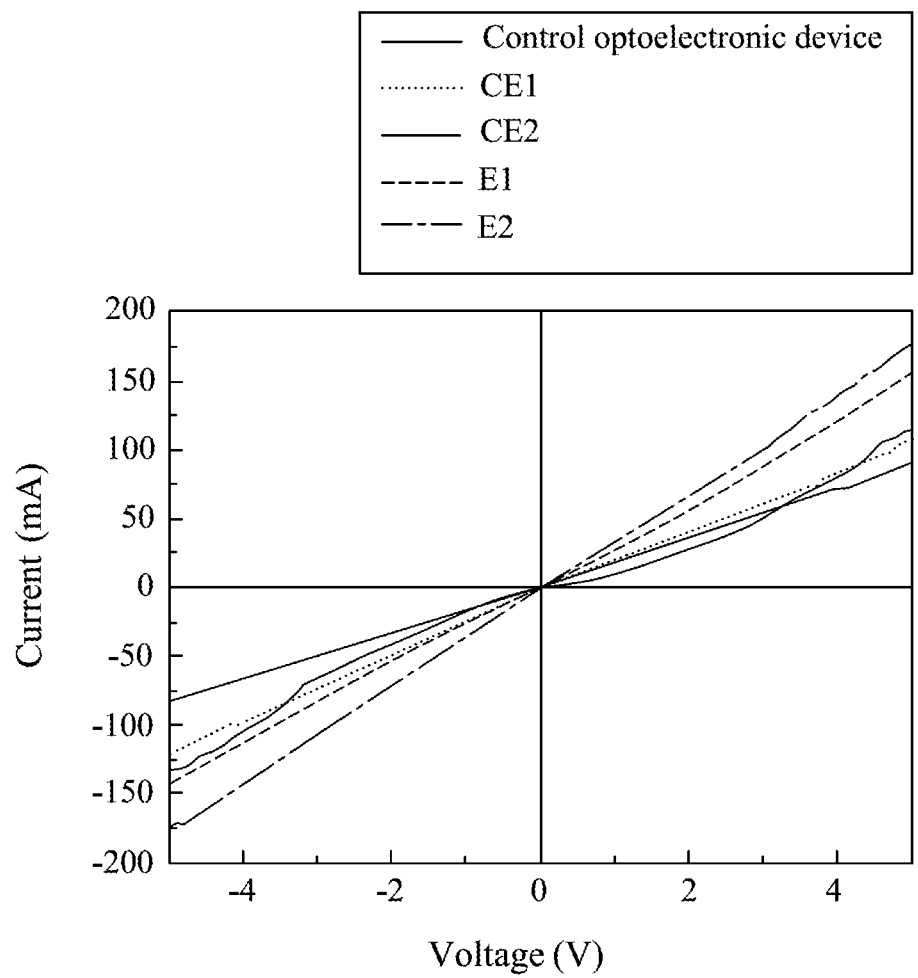
FIG. 4 is a graph illustrating current versus voltage for a control optoelectronic device (not subjected to a repair treatment) and optoelectronic devices repaired by methods of Examples 1 to 2 (E1-E2) and Comparative Examples 1 to 2 (CE1-CE2)

As shown in FIG. 4, when the same voltage was applied to each of the optoelectronic devices, as compared to the control optoelectronic device and those treated by the methods of CE1 and CE2, the optoelectronic devices 3 repaired by the methods of E1 and E2 showed better current response (i.e., higher values of current), as compared to the control optoelectronic device and to those treated by the methods of CE1 and CE2. The result may be attributed to the use of aqueous ammonia in E1 and E2 as the nitrogen-containing working liquid 6, which was atomized to form an aqueous ammonia spray and then dissociated to form ammonium ions ($NH_4^+$) and hydroxide ions ($OH^-$) in the heated reaction chamber 51. The ammonium ions ($NH_4^+$) is believed to be capable of removing native oxides formed on the etched aluminum nitride-based epitaxial layer 33 to expose dangling bonds, and the hydroxide ions ($OH^-$) is believed to be capable of binding to the thus exposed dangling bonds (i.e., more oxygen atoms are attracted on the aluminum nitride-based epitaxial layer 33). As such, the etching damage on the aluminum nitride-based epitaxial layer 33 could be repaired, and more free electrons provided thereon are effective in enhancing the optoelectronic property of the optoelectronic devices 3 repaired by the methods of E1 and E2.

In particular, as compared to E1, the optoelectronic device 3 repaired by the method of E2, in which nitrogen gas and aqueous ammonia were used, showed superior optoelectronic property. The reason may be that the aqueous ammonia itself contains water which may form more aqueous ammonia when it reacts with the nitrogen gas, and thus more ammonium ions ($NH_4^+$) and hydroxide ions ($OH^-$) may be formed, so that the etching damage on the aluminum nitride-based epitaxial layer 33 could be effectively repaired.

In contrast, despite using nitrogen gas in CE2, the deionized water that was atomized and then introduced into the reaction chamber 51 was unable to form ammonium ions ($NH_4^+$) for removing the native oxides. Moreover, in CE1, the nitrogen-containing working liquid 6 was dispensed with and only the nitrogen gas was introduced into the heated reaction chamber 51 with a predetermined temperature of 800° C., at which the nitrogen gas was not susceptible to dissociate into nitrogen atom.

2. Contact Resistance

Figure 5:
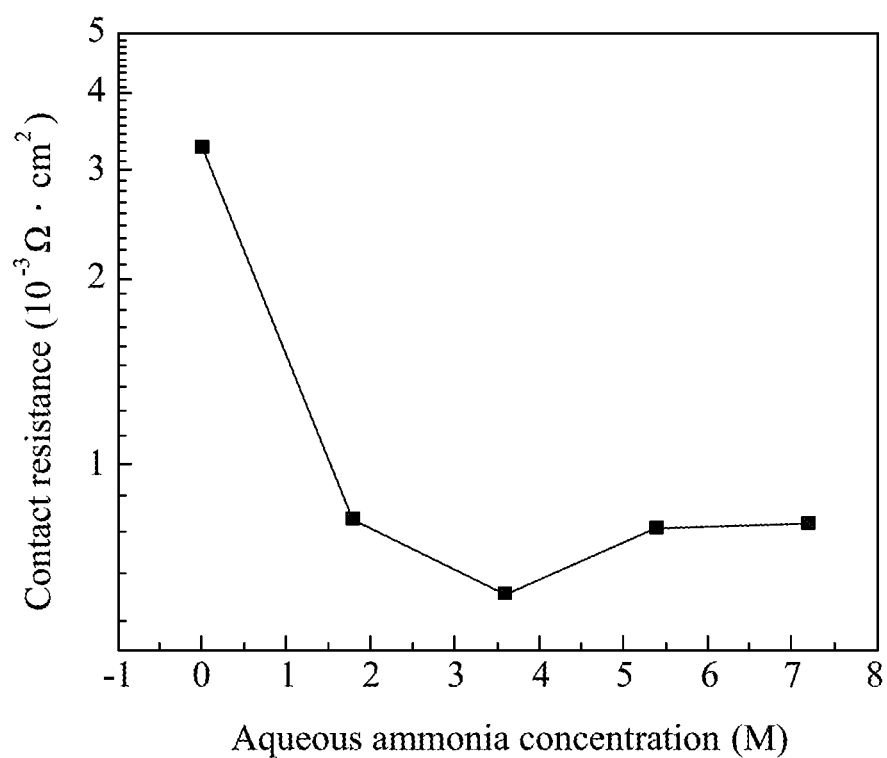
FIG. 5 is a graph illustrating contact resistance versus aqueous ammonia concentration for the optoelectronic device repaired by the method of E2.

The contact resistance between the Ti/Al/Ti/Au electrode 37 and a respective one of the aluminum nitride-based epitaxial layers 33 repaired by the method of E2 at different aqueous ammonia concentrations (i.e., 1.8 M, 3.6 M, 5.4 M and 7.2 M) and that treated by the method of CE1 was determined using circular transmission line model (CTLM). As shown in FIG. 5, as compared to CE1, the contact resistance between the Ti/Al/Ti/Au electrode 37 and the aluminum nitride-based epitaxial layer 33 repaired by the method of E2 at a respective aqueous ammonia concentration was effectively reduced. In particular, the lowest value of contact resistance was achieved when aqueous ammonia with a concentration of 3.6 M was used as the nitrogen-containing working liquid 6 for repairing the etching damage on the optoelectronic device 3. Therefore, the optoelectronic device 3 repaired by the method of E2 using 3.6 M of the aqueous ammonia was subjected to the following analysis.

3. Light Output Power and External Quantum Efficiency (EQE) Analysis

The light output power at different currents for the optoelectronic device 3 repaired by the method of E2 and the control optoelectronic device were respectively measured using an integrating sphere detector (CAS 140B, Instrument Systems), and the EQE thereof was determined according to the following equation: EQE=light output power/input power, wherein the input power is represented by input current x forward voltage.

Figure 6:
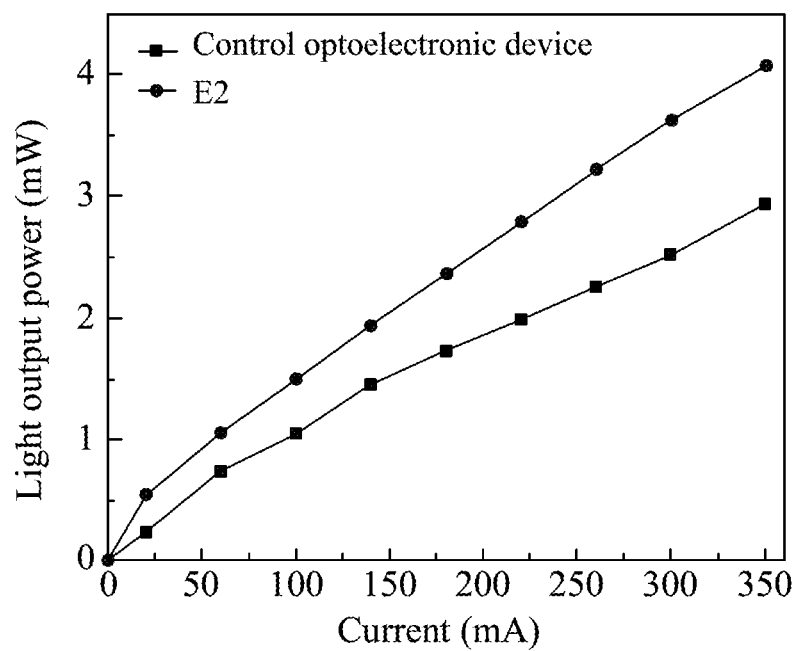
FIG. 6 is a graph illustrating optical output power versus current for the optoelectronic device repaired by the method of E2 and the control optoelectronic device.
Figure 7:
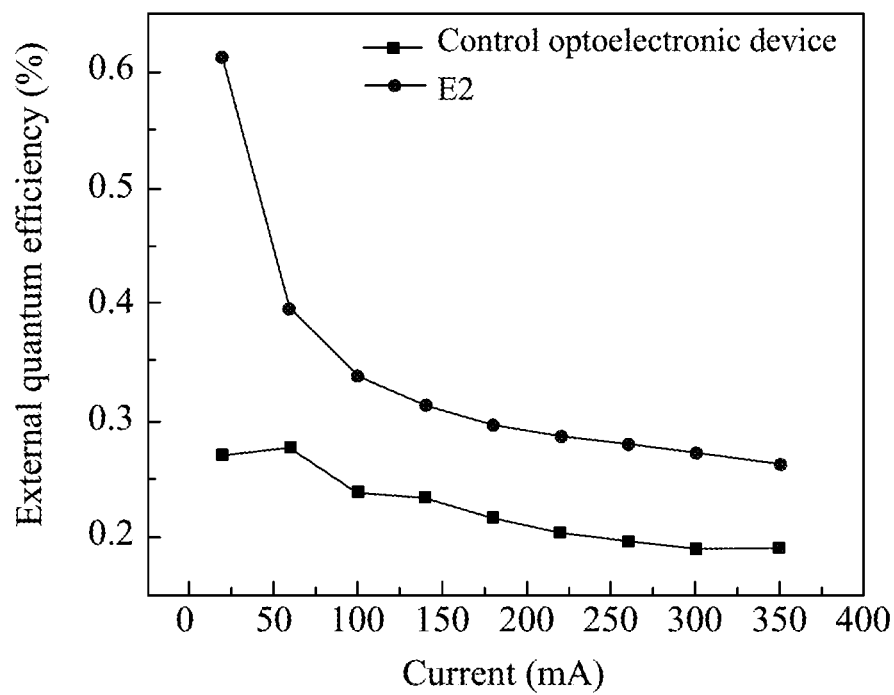
FIG. 7 is a graph illustrating external quantum efficiency versus current for the optoelectronic device repaired by the method of E2 and the control optoelectronic device.

It can be seen in FIGS. 6 and 7 that, as compared to the control optoelectronic device, the optoelectronic device 3 repaired by the method of E2 showed better light output power and EQE in the entire range of measured currents.

4. Atomic Ratio of Nitrogen to Oxygen (N/O)

The aluminum nitride-based epitaxial layer 33 of the optoelectronic device 3 repaired by the method of E2 was subjected to the determination of N/O atomic ratio (based on 100% of aluminum, gallium, nitride and oxygen elements) using X-ray photoelectron spectroscopy (XPS) For comparison, the control optoelectronic device having the aluminum nitride-based epitaxial layer 33 not subjected to any treatment after plasma etching, and an unetched optoelectronic device having an aluminum nitride-based epitaxial layer 33 not subjected to plasma etching were subjected to the same analysis.

Figure 8:
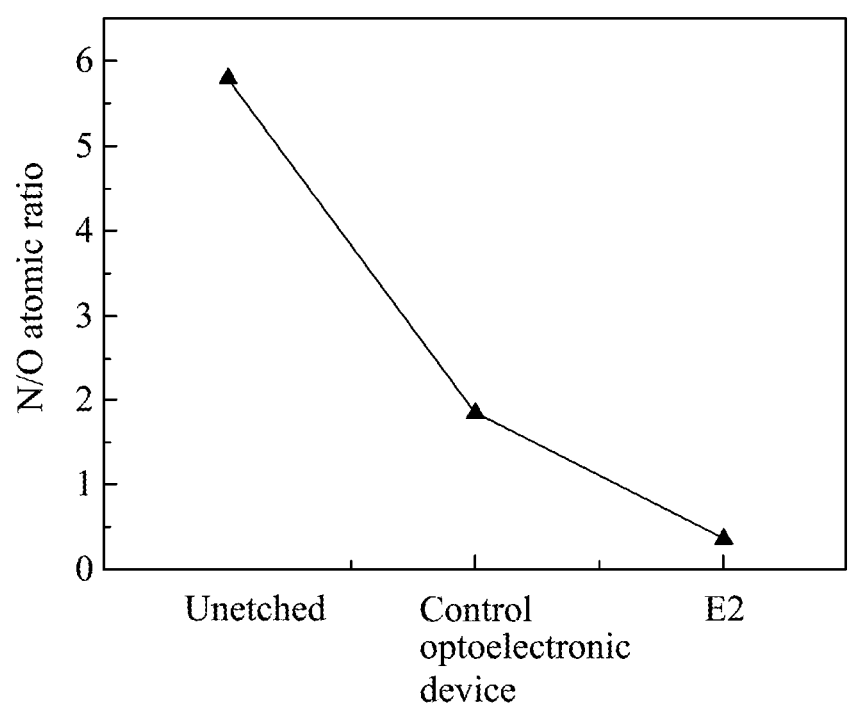
FIG. 8 is a graph illustrating atomic ratios of nitrogen to oxygen for an unetched optoelectronic device, the control optoelectronic device, and the optoelectronic device repaired by the method of E2.

As shown in FIG. 8, among the three optoelectronic devices, the unetched optoelectronic device had the highest atomic ratio of nitrogen to oxygen, indicating that the aluminum nitride-based epitaxial layer 33 of the unetched optoelectronic device had more N atoms bounded to each other on the surface thereof (i.e., no breakage of nitrogen bonds). The etched aluminum nitride-based epitaxial layer 33 of the control optoelectronic device had the N/O atomic ratio (approximately 1.8) lower than that of the unetched optoelectronic device, which indicates that plasma etching would destroy nitrogen bonds to generate dangling bonds, causing nitrogen depletion (i.e., N vacancies) and formation of native oxides on the aluminum nitride-based epitaxial layer 33. Likewise, the aluminum nitride-based epitaxial layer 33 of the optoelectronic device 3 repaired by the method of E2 had N/O atomic ratio significantly lower than that of the control optoelectronic device (i.e., lower than 1.8), mainly because the native oxides formed on the aluminum nitride-based epitaxial layer 33 would be removed by the ammonium ion ($NH_4^+$), and the thus exposed dangling bonds would react with the hydroxide ions ($OH^-$) That is, more oxygen atoms were bound to the dangling bonds on the repaired aluminum nitride-based epitaxial layer 33 (i.e., oxygen doping) to provide more free electrons, which in turn may cause Fermi level to move closer to the conduction band edge, and thus the repaired aluminum nitride-based epitaxial layer 33 and the Ti/Al/Ti/Au electrode 37 can form a good ohmic contact with low contact resistance, thereby improving the performance of the optoelectronic device 3.

In summary, by virtue of introducing the nitrogen-containing spray formed by atomizing the nitrogen-containing working liquid 6, the etching damage on the nitride-based epitaxial layer 33 of the optoelectronic device 3 can be effectively repaired during the annealing treatment, and thus the performance of the optoelectronic device 3 repaired therefrom may be significantly improved. Therefore, the method of the present disclosure, which includes simple processing steps, may not only enhance the efficiency for repairing etching damage on the nitride-based epitaxial layer 33 but also reduce the manufacturing cost of the optoelectronic device 3.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for repairing etching damage on a nitride-based epitaxial layer of an optoelectronic device, comprising the steps of:
   (A) providing a nitrogen-containing working liquid which is an aqueous ammonia, and an annealing apparatus having a reaction chamber;
   (B) heating the reaction chamber of the annealing apparatus to a predetermined temperature;
   (C) supplying a carrier gas to atomize the nitrogen-containing working liquid so as to obtain a nitrogen-containing spray, and then introducing the nitrogen-containing spray into the reaction chamber; and
   (D) subjecting the optoelectronic device to an annealing treatment in the reaction chamber of the annealing apparatus in the presence of the nitrogen-containing spray, so as to repair the etching damage on the nitride-based epitaxial layer of the optoelectronic device.

2. The method as claimed in claim 1, wherein in step (A), an atomizing apparatus is further provided to be configured to connect to the annealing apparatus, the atomizing apparatus including a vessel for the nitrogen-containing working liquid to be accommodated therein, and a flow control valve connecting the vessel and the reaction chamber, the vessel including an inlet for the carrier gas to be introduced therein, and an outlet connected to the flow control valve to discharge the nitrogen-containing spray.

3. The method as claimed in claim 1, wherein the carrier gas is selected from the group consisting of nitrogen gas, argon gas, oxygen gas, hydrogen gas, helium gas and combinations thereof.

4. The method as claimed in claim 1, wherein the nitride-based epitaxial layer includes $Al_xGa_{1-x}N$, in which $0.1 \leq x \leq 0.7$.

5. An optoelectronic device, comprising:
a substrate;
a buffering layer disposed on said substrate;
a repaired nitride-based epitaxial layer disposed on said buffering layer, said repaired nitride-based epitaxial layer being repaired by the method as claimed in claim 1 and having an atomic ratio of nitrogen to oxygen which is less than 1.8;
a light-emitting layer disposed on said epitaxial layer and exposing a portion of said repaired nitride-based epitaxial layer;
a contacting layer disposed on said light-emitting layer;
a first electrode disposed on said exposed portion of said repaired nitride-based epitaxial layer; and
a second electrode disposed on said contacting layer.

6. The optoelectronic device as claimed in claim 5, wherein said repaired nitride-based epitaxial layer includes $Al_xGa_{1-x}N$, in which $0.1 \leq x \leq 0.7$.

7. The optoelectronic device as claimed in claim 5, further comprising an electron-blocking layer disposed between said light-emitting layer and said contacting layer.

* * * * *